United States Patent [19]

Shannon

[11] Patent Number: 5,179,035

[45] Date of Patent: Jan. 12, 1993

[54] METHOD OF FABRICATING TWO-TERMINAL NON-LINEAR DEVICES

[75] Inventor: John M. Shannon, Whyteleafe, England

[73] Assignee: U.S. Philips Corporation, New York, N.Y.

[21] Appl. No.: 856,186

[22] Filed: Oct. 15, 1991

Related U.S. Application Data

[63] Continuation of Ser. No. 566,639, Aug. 13, 1990, abandoned.

[30] Foreign Application Priority Data

Sep. 15, 1989 [GB] United Kingdom ............... 8920964

[51] Int. Cl.$^5$ ............................................ H01L 21/70
[52] U.S. Cl. ...................... 437/51; 437/226; 437/904; 437/905; 437/974; 148/DIG. 28; 148/DIG. 135
[58] Field of Search ............ 437/51, 54, 904, 905, 437/906, 181, 226, 227, 127, 974; 350/334; 148/DIG. 28, DIG. 135, DIG. 174, DIG. 64, DIG. 65

[56] References Cited

U.S. PATENT DOCUMENTS

| | | | |
|---|---|---|---|
| 3,471,923 | 10/1969 | Lamorte et al. | 437/906 |
| 3,622,712 | 11/1971 | Moore | 437/905 |
| 3,781,975 | 1/1974 | Ressel et al. | 437/904 |
| 4,237,601 | 12/1980 | Woolhouse et al. | 437/904 |
| 4,341,010 | 7/1982 | Tijburg et al. | 437/249 |
| 4,413,883 | 11/1983 | Baraff et al. | 350/334 |
| 4,499,659 | 2/1985 | Varteresian et al. | 437/228 |
| 4,523,811 | 6/1985 | Ota | 350/333 |
| 4,534,623 | 8/1985 | Araki | 350/333 |
| 4,589,733 | 5/1986 | Yaniv et al. | 350/333 |
| 4,652,333 | 3/1987 | Carney | 437/225 |
| 4,660,275 | 4/1987 | Lo | 148/DIG. 28 |
| 4,723,837 | 2/1988 | Masubuchi | 350/334 |
| 4,775,645 | 10/1988 | Kurata et al. | 437/904 |
| 4,861,141 | 8/1989 | Nakazawa | 350/334 |
| 4,883,773 | 11/1989 | Ishikura | 148/DIG. 135 |
| 4,983,022 | 1/1991 | Shannon | 350/334 |

FOREIGN PATENT DOCUMENTS

| | | |
|---|---|---|
| 2373879 | 7/1978 | France . |
| 55-93234 | 7/1980 | Japan . |
| 0007434 | 1/1981 | Japan . |
| 0107563 | 8/1981 | Japan . |
| 0176143 | 8/1987 | Japan . |

Primary Examiner—Brian E. Hearn
Assistant Examiner—Michael Trinh
Attorney, Agent, or Firm—Norman N. Spain

[57] ABSTRACT

Large numbers of small sized, physically discrete, two-terminal non-linear devices, typically around 20 μm across, are produced simultaneously, each exhibiting substantially identical physical and electrical properties by forming on the surface of a temporary support a multiple layer formation consisting of a series of thin film layers of selected materials and uniform thicknesses constituting a diode structure, for example a MIM type or p-n-p punch-through type structure; scribing the multiple layer formation in a regular pattern to define portions; and thereafter removing the support and separating the portions into physically discrete elements, each of which forms an individual non-linear device.

27 Claims, 2 Drawing Sheets

METHOD OF FABRICATING TWO-TERMINAL NON-LINEAR DEVICES

This is a continuation of application Ser. No. 07/566,639 filed Aug. 13, 1990, now abandoned.

BACKGROUND OF THE INVENTION

This invention relates to two-terminal non-linear devices and methods for their fabrication.

In certain electronic applications there exists the need for two-terminal non-linear devices whose physical dimensions are very small, and much smaller than the dimensions of commonly available discrete non-linear devices. One such application is active matrix switching in which two-terminal non-linear devices function as control switches. An example of this application is active matrix addressed electro-optical display devices having a row and column array of individual display elements, such as liquid crystal display elements, and in which one or more two-terminal non-linear device in the form of diode structure is connected in series between a display element electrode and an associated address conductor. These devices are located adjacent their respective display elements. For TV picture display purposes the display elements are generally rectangular in shape and usually have a maximum dimension of around 200 $\mu$m. The physical size of the associated non-linear device needs to be much less so that as great a proportion as possible of the area occupied by a display element electrode and its associated non-linear device is devoted to the display element electrode for maximising display effect. Typically, such a display device can have around 200,000 display elements.

Because of the large numbers required and the small size demanded for the non-linear devices in such applications, the conventional approach hitherto has been to fabricate the non-linear devices in situ as individual multi-layer thin film diode structures in an array on a common substrate, together with the display element electrodes and address conductors, using complex photolithographic techniques. Non-linear devices in the form, for example, of MIM, back to back, or n-i-n diode structures have been employed, typically occupying a maximum, lateral, dimension of a few tens of microns, say 30 $\mu$m. Although this approach has been generally accepted, the extensive photolithography required in depositing and patterning the series of thin film layers entailed has certain drawbacks, most particularly because of the desire for increasingly larger display devices and the complexity and expense of the equipment necessary to achieve this.

In the Applicant's co-pending British Patent Application No. 8920963.9 (PHB33587) there is described an alternative approach to constructing active matrix arrays which is especially suited to producing large area display devices. This involves providing the address conductors and display element electrodes in planar arrays spaced from one another with prefabricated, discrete, two-terminal non-linear devices situated between the two arrays and electrically connected between the display element electrodes and the address conductors. The discrete devices can be distributed over one or other of the arrays in a quasi-random manner before bringing the two arrays together or alternatively distributed in quasi-random manner in a polymer film which is disposed between the two arrays. The density of the distributed devices is such as to ensure that at least one device is situated between each display element electrode and the associated conductor. For more details of this active matrix display device reference is invited to the aforementioned application, whose disclosure in this respect is incorporated herein by reference.

OBJECTS AND SUMMARY OF THE INVENTION

It is an object of the present invention to provide two-terminal non-linear devices suitable for use in active matrix arrays.

Of course, it is envisaged that discrete two-terminal non-linear devices can be used in many electronic applications other than that specifically described above.

Accordingly, it is another object of the present invention, therefore, to provide a method of making physically discrete two-terminal non-linear devices in bulk, which method is simple, reliable and inexpensive.

According to the present invention there is provided a method of fabricating two-terminal non-linear devices, the method comprising the steps of forming on the surface of a support a multiple layer formation comprising a series of thin film layers of selected materials constituting a diode structure, scribing the multiple layer formation to define portions thereof, and thereafter removing the support and physically separating the portions into discrete elements each constituting a non-linear device.

Using the method, small-sized discrete non-linear devices can be fabricated in bulk simply and conveniently. The method enables large numbers of devices to be produced simultaneously, all of which have similar physical and electrical characteristics. By scribing the multiple layer formation, for example, linearly in regularly spaced rows and columns, the portions defined, and hence the individual elements when separated, will have predetermined and substantially identical physical dimensions. Because the devices are formed from common layers, then providing the layers are each formed of uniform thickness over their area, which would be easy to achieve in practice, it can be expected that the resulting, separated, elements will all be of highly uniform thickness and will exhibit substantially identical non-linear electrical characteristics in operation.

A typical device produced by this method may have an overall thickness, corresponding generally to the thickness of the multiple layer formation, of several micrometres, whereas its lateral dimensions, as determined by scribing, may be around a few tens of micrometres. Thus the non-linear devices will be of slab shape. Because the devices are formed as thin film structures, the opposing, major surfaces of a device, which it will be understood constitute respectively its two terminals, are substantially flat and parallel.

The non-linear devices are therefore particularly well suited to serve for example, as active spacing elements between two, two-dimensional, conductor arrays situated in parallel and spaced planes, with the two terminals of the device contacting respective conductors of the arrays, thereby forming a three-dimensional circuit configuration in which the conductors are interconnected through the non-linear device. An illustration of such use is given in the previously-mentioned active matrix display device described in British Patent Application No. 8920963.9 (PHB 33587) in which the non-linear devices are disposed between two planar arrays of address conductors and display element electrodes, producing a three dimensional switching matrix configuration. Using non-linear devices fabricated in accordance with the invention, such a display device is simpler to construct than conventional two dimensional configurations in which the non-linear devices are formed in situ together with arrays of address conductors and display element electrodes on a common substrate, especially for large area displays. The non-linear devices may be distributed independently on the surface of one of the arrays, with the other arrays then being brought into position over the devices, or alternatively may be distributed in a polymer matrix forming a film which, for example, may then be sandwiched between the arrays.

After separation from the temporary support, the non-linear devices in bulk can be regarded as taking the form of a powder. When using the devices in the above-described application, the devices can be distributed by scattering, for instance, using a spinning technique. The slab shape of the devices assists in ensuring proper orientation of the devices when distributed, as they will tend to fall onto one or other of their major surfaces. Because, as will be described, suitable forms of devices are bidirectional with symmetrical structural layers, it is not important which way they fall.

Naturally, the non-linear devices can be used in other applications where small-size, physically discrete devices are required.

Scribing of the multiple layer formation may be completely or partly through the thickness of the formation. In the former case, the portions are separated upon removal of the support. In the latter case, the portions will likely still be interconnected after removal of the support. They can then be separated by cleaving. This may be accomplished conveniently by performing a rolling operation on the scribed multiple layer formation.

The support is preferably removed by etching, the material of the support being suitably chosen in relation to the materials of the layers to allow this.

In one embodiment, the layers of the formation, determining the type of non-linear device, are selected to provide a MIM structure. These layers may be deposited separately in sequence, and to the required thickness. Alternatively, the first-formed layer may be of an anodisable material, for example tantalum, which is subjected in situ on the support to an anodisation process to form the insulative layer of the MIM structure, for example tantalum pentoxide. The final layer of the structure is then deposited over the insulative layer. The support preferably comprises polyimide which can be etched away conveniently using an etchant which does not react with the multiple layer formation.

In another embodiment, the layers of the multiple layer formation are of materials and thicknesses selected to provide a p-n-p, n-p-n, p-i-p or n-i-n diode structure. These layers may be built up on a polyimide support using amorphous semiconductor, e.g. silicon, material. Preferably, however, the layers are formed on a single crystal semiconductor, for example, silicon, wafer using an epitaxial process such as chemical vapour deposition or molecular beam epitaxy processes.

BRIEF DESCRIPTION OF THE DRAWING

Methods, and two-terminal non-linear devices produced thereby, in accordance with the present invention will now be described, by way of example, with reference to the accompanying drawings in which.

It will be appreciated that the Figures are merely schematic and for clarity are not drawn to scale. In particular certain dimensions such as the thickness of the layers or regions have been exaggerated while other dimensions have been reduced.

DESCRIPTION OF THE PREFERRED EMBODIMENTS

The methods used for fabricating both types of diode devices involve forming on the surface of a temporary support a series of thin film layers of selected materials which constitute a two-terminal non-linear diode structure. This multiple layer structure is then scribed to define portions thereof and then the support is removed and the portions separated from one another to form physically discrete elements of a size determined by the scribing pattern, each of which comprises a non-linear device having the preselected diode structure.

The temporary support, or at least a portion thereof on which are provided the thin film layers that subsequently form the non-linear devices, may be rectangular and of several centimetres in length and width. Assuming the non-linear devices to be produced are typically around a few tens of micrometres in size, then it will be appreciated that many hundreds of thousands of devices are fabricated by the method simultaneously, all of which can be expected to have substantially identical physical and electrical properties.

The non-linear devices whose fabrication will be described are bidirectional devices employing a symmetrical configuration of constituent thin film layers. The methods could however be employed to produce bidirectional non-linear devices exhibiting asymmetric electrical characteristics or unidirectional non-linear devices if desired by appropriate choice of layers.

Figure 1:
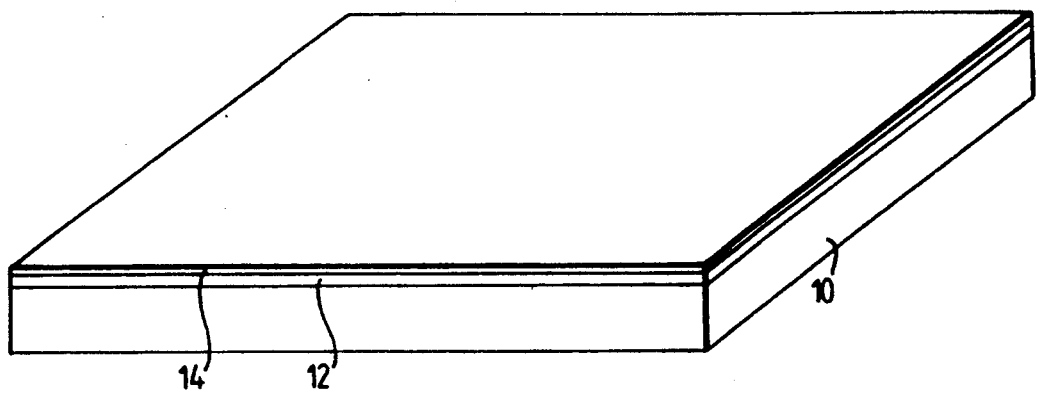
FIGS. 1 to 3 illustrate schematically and at various stages the fabrication of discrete MIM type non-linear devices using a method according to the invention.
Figure 2:
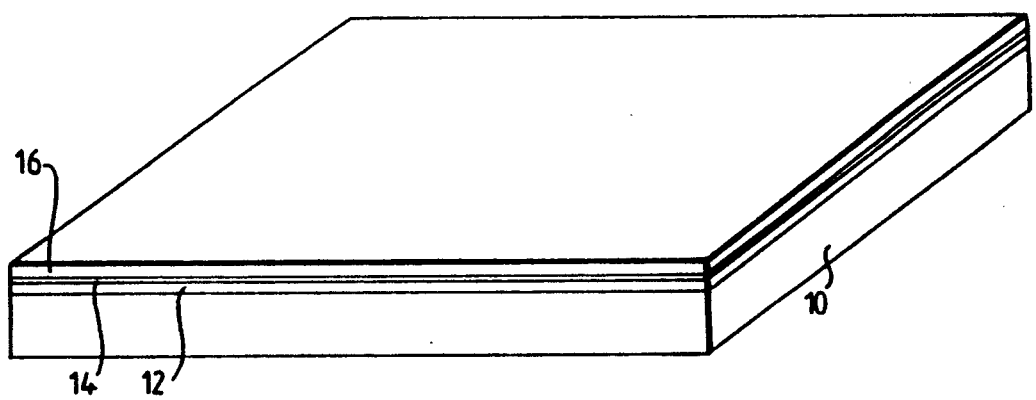
Figure 3:
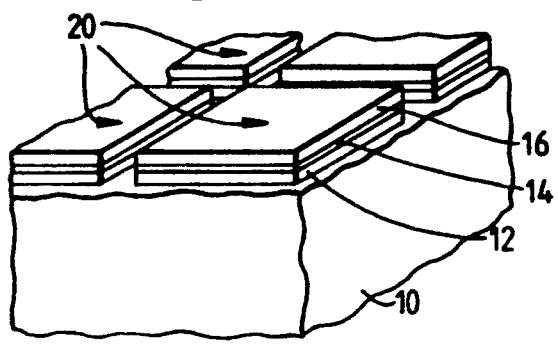

With regard to FIGS. 1 to 3, the fabrication of MIM type diode devices having a tantalum-tantalum pentoxide-tantalum series layer structure is illustrated. Firstly, and as shown in FIG. 1, a layer 12 of tantalum is evaporated onto a polyimide (e.g. Kapton) support film 10 to a uniform thickness of approximately 2.5 μm. The layer 12 is then subjected to an anodisation process using, for example, a weak citric acid solution at an anodising voltage of between 30 and 60 volts to produce a uniform thin film 14 of insulative tantalum pentoxide approximately 0.1 μm in thickness at its surface remote from the support film 10. Following this, a further layer 16 of tantalum is evaporated over the surface of the film 14 to a uniform thickness of approximately 2.5 μm, as shown in FIG. 2. All three thin film layers 12, 14 and 16 are formed as continuous and co-extensive layers on the support film.

The triple layer formation thus formed is then reticulated by scribing linearly in a regular pattern of rows and columns using a diamond scribing tool or possibly a laser in known manner to define individual rectangular portions of the formation, each portion having dimensions of approximately 10 μm by 20 μm. This scribing may be completely or partially through the thickness of the formation. FIG. 3 shows schematically a small, representative, part of the structure following scribing, which in this case has been carried out to a depth equal to the combined thickness of the three layers, in which one complete and three parts of these individual portions, here referenced 20, defined by scribing are present.

The polyimide support film 10 is then removed by means of a dry etching (plasma etching) process or a wet etching process using hydrazine. Upon removal of the film, the portions 20 of the triple layer structure become separated into physically discrete elements each of which constitutes a MIM device. If only partial scribing is employed most of the portions 20 will probably still be joined together after removal of the support film. This may also happen in practice to some portions even if complete scribing is attempted. The portions can easily be physically separated by placing the structure on a suitable substrate and subjecting the structure to rolling which breaks it up into its defined individual elements.

In this way, many hundreds of thousands of discrete rectangular slab shaped MIM devices of approximately 10 by 20 $\mu$m and comprising a thin film of tantalum pentoxide 14 sandwiched between tantalum layers 12 and 16 whose overall, uniform, thickness is approximately 5 $\mu$m, are produced. The two opposing flat major surfaces of the elements formed by the tantalum layers 12 and 16 constitute respective terminals of the devices.

MIM devices using different materials known in the art can be fabricated using this general method. Other examples of metallization materials are aluminium, chromium, nickel or titanium. The intermediate, insulative film need not be formed through anodisation but may instead be deposited as a separate layer over the layer 12. Suitable alternative insulative layer materials are aluminum oxide (which can be formed by anodising a layer 12 of aluminium) silicon nitride and silicon oxynitride.

Figure 4:
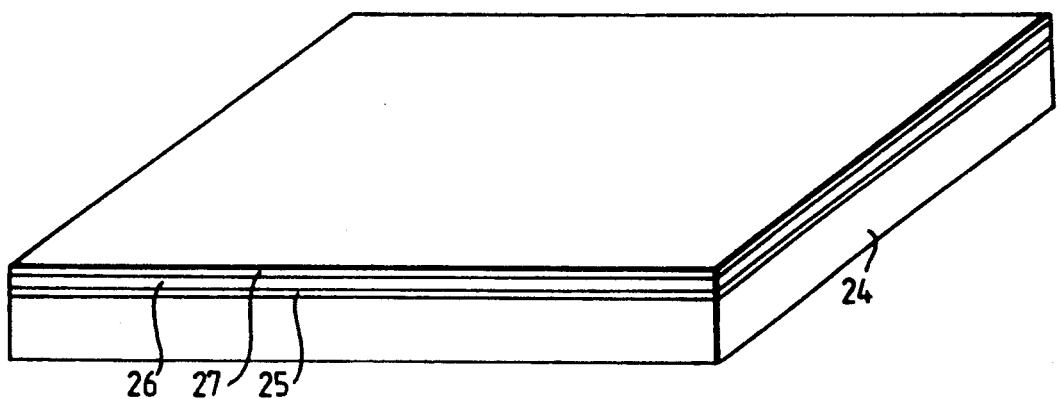
FIGS. 4 to 6 illustrate schematically and similarly at various stages the fabrication of discrete p-n-p type diode devices using a method according to the invention.
Figure 5:
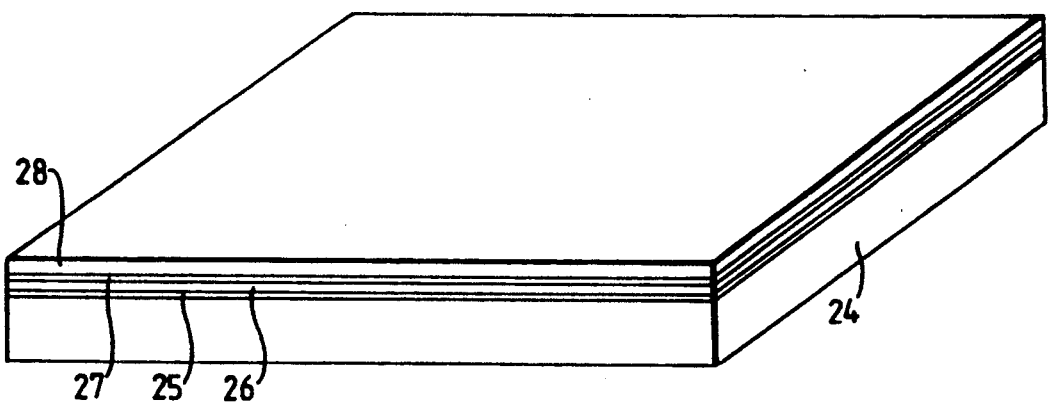
Figure 6:
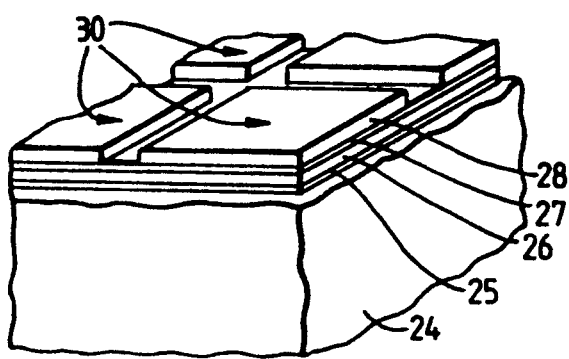

FIGS. 4 to 6 illustrate in generally similar manner the fabrication of back-to-back punch-through type diode devices, and in particular devices having a p-n-p diode structure.

In this method a wafer 24 of n+ single crystal silicon is used for the temporary support. A rectangular portion of this wafer is shown in the figures.

Successive, continuous, layers of uniform thickness are grown on the wafer 24 by an epitaxial process, using either CVD or MBE techniques. These directly superimposed layers comprise, in order starting from the wafer surface, a 0.1 $\mu$m thick lightly doped p type layer 25, a 4 $\mu$m thick p+ type layer 26, a 2 $\mu$m thick n type layer 27 and a 4 $\mu$m thick p+ type layer 28.

The multiple layer formation thus produced on the wafer is then reticulated by linearly scribing in a regular pattern of rows and columns, possibly completely but preferably only partly through the thickness of the formation, to define individual rectangular portions 30 approximately 20 $\mu$m by 40 $\mu$m in dimension. A diamond scribing tool is used, forming surface grooves on the formation of a depth sufficient to enable cleaving.

FIG. 6 shows schematically a small, representative, part of the structure following scribing, in this case substantially to a depth approximately equal to the thickness of the upper layer 28 of the formation. One complete and parts of three other portions 30 are present in this view.

The n+ type wafer 24 is then removed by etching using 0.5% HF in HNO$_3$. The p type layer 25 is provided to act as an etch stop so that etching finishes at the boundary of this layer.

Upon removal of the wafer 24, the individual portions 30 defined by scribing are separated into physically discrete elements, by performing a cleaving operation, most conveniently by rolling. Each element constitutes a punch through diode device having a p+-n-p+ structure. The devices also include a respective portion of the very thin p type layer 25. Because it is very thin and lightly doped, this layer adds very little resistance and would not affect adversely the required operation of the diode device. However, if desired the layer 25 can be removed from the individual elements by subjecting them to a non-selective silicon etch. This would result in an insignificant surface portion of the layer 28 also being removed. This operation would serve advantageously also to clean up the elements.

The individual punch through diode devices thus formed each comprise a rectangular slab-shaped structure of approximately 20 $\mu$m by 40 $\mu$m and having a uniform thickness of approximately 10 $\mu$m. The opposing flat major surfaces of the structure constitute respective terminals. Using a wafer 24 of several centimeters, many hundreds of thousands of devices are produced simultaneously using this method, all of which, because they are formed from common layers, have substantially identical physical and electrical properties.

The same general method can be used to fabricate non-linear devices having different types of diode structures, for example n-p-n, n-i-n, or p-i-p structures.

These diode structures may alternatively be fabricated using amorphous semiconductor material. For example, the multiple layer formations can be produced on a polyimide support from amorphous silicon material using standard techniques for this material, as will be apparent to persons skilled in the art.

I claim:

1. A method of fabricating two-terminal non-linear devices comprising the steps sequentially depositing a series of separate thin film layers of selected material on a surface of a support to form a multiple layer formation on said surface, said multiple layer formation constituting a diode structure; scribing the multilayer formation to define portions thereof and thereafter removing said support from the portions and physically separating the portions into discrete elements each constituting a non-linear device.

2. A method according to claim 1, characterised in that the multiple layer formation is scribed completely through its thickness to define individual portions thereof.

3. A method according to claim 1, characterised in that the multiple layer formation is scribed through a part only of its thickness.

4. A method according to claim 3, characterised in that following the removal of the support the multiple layer formation is subjected to a rolling operation to separate the portions into physically discrete elements.

5. A method according to claim 1, characterised in that the support is removed by etching.

6. A method according to claim 1, characterised in that the materials of the thin film layers are selected to provide a MIM structure.

7. A method according to claim 6, characterised in that the first deposited layer of the multiple layer formation comprises a deposited layer of anodisable metal and in that following deposition of this layer an anodisation operation is performed to produce an insulative surface layer.

8. A method according to claim 7, characterised in that the first deposited layer comprises tantalum which is anodised to form a surface layer of tantalum pentoxide.

9. A method according to claim 6, characterised in that the thin film layers are provided as separately deposited layers.

10. A method according to claim 6, characterised in that the support comprises a polyimide material.

11. A method according to claim 1, characterised in that the materials of the thin film layers are selected to provide a p-n-p, n-p-n, p-i-p or n-i-n diode structure.

12. A method according to claim 11, characterised in that the support comprises a single crystal semiconductor wafer and in that the thin film layers are deposited using an epitaxial process.

13. A method according to claim 11, characterised in that the thin film layers comprise amorphous semiconductor material.

14. A method according to claim 2, characterized in that the support is removed by etching.

15. A method according to claim 3, characterized in that the support is removed by etching.

16. A method according to claim 4, characterized in that the support is removed by etching.

17. A method according to claim 2, characterized in that the materials of the thin film layers are selected to provide a MIM structure.

18. A method according to claim 3, characterized in that the materials of the thin film layers are selected to provide a MIM structure.

19. A method according to claim 4, characterized in that the materials of the thin film layers are selected to provide a MIM structure.

20. A method according to claim 5, characterized in that the materials of the thin film layers are selected to provide a MIM structure.

21. A method according to claim 7, characterized in that the support comprises a polyimide material.

22. A method according to claim 8, characterized in that the support comprises a polyimide material.

23. A method according to claim 9, characterized in that the support comprises a polyimide material.

24. A method according to claim 2, characterized in that the material of the thin film layers are selected to provide a p-n-p, n-p-n, p-i-p or n-i-n diode structure.

25. A method according to claim 3, characterized in that the material of the thin film layers are selected to provide a p-n-p, n-p-n, p-i-p or n-i-n diode structure.

26. A method according to claim 4, characterized in that the material of the thin film layers are selected to provide a p-n-p, n-p-n, p-i-p or n-i-n diode structure.

27. A method according to claim 5, characterized in that the material of the thin film layers are selected to provide a p-n-p, n-p-n, p-i-p or n-i-n diode structure.

* * * * *